United States Patent
Hong et al.

(10) Patent No.: US 7,057,964 B2
(45) Date of Patent: Jun. 6, 2006

(54) SEMICONDUCTOR MEMORY DEVICE WITH EFFICIENT MULTIPLEXING OF I/O PAD IN MULTI-CHIP PACKAGE

(75) Inventors: Sang-Hoon Hong, Ichon-shi (KR); Jae-Bum Ko, Ichon-shi (KR); Se-Jun Kim, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 11/015,421

(22) Filed: Dec. 20, 2004

(65) Prior Publication Data

US 2005/0141254 A1 Jun. 30, 2005

(30) Foreign Application Priority Data

Dec. 29, 2003 (KR) ........................ 10-2003-0098509

(51) Int. Cl.
*G11C 8/00* (2006.01)
(52) U.S. Cl. ............................. 365/230.08; 365/230.02
(58) Field of Classification Search ................ 365/164, 365/189.02, 189.03, 189.05, 230.02, 230.08

See application file for complete search history.

(56) References Cited

U.S. PATENT DOCUMENTS

| | | | |
|---|---|---|---|
| 5,249,160 A * | 9/1993 | Wu et al. | 365/230.08 |
| 6,272,053 B1 * | 8/2001 | Choi | 365/189.03 |
| 6,507,514 B1 * | 1/2003 | Tsao et al. | 365/185.17 |
| 6,687,855 B1 * | 2/2004 | Krech et al. | 714/30 |
| 6,873,563 B1 * | 3/2005 | Suwa et al. | 365/230.03 |

\* cited by examiner

*Primary Examiner*—Tuan T. Nguyen
*Assistant Examiner*—Alexander Sofocleous
(74) *Attorney, Agent, or Firm*—Mayer, Brown, Rowe & Maw LLP

(57) ABSTRACT

A semiconductor memory device includes: a memory core area; a plurality of address input pads for transferring addresses; a first address buffer part for receiving the addresses and outputting first addresses; a plurality of multi I/O pads for inputting/outputting data or inputting/outputting addresses/data while multiplexing the addresses/data; a data I/O buffer part for receiving data from the plurality of multi I/O pads and transferring the data to the memory core area or receiving and outputting addresses; a second address buffer part for receiving the addresses from the data I/O buffer part and outputting second addresses; an address multiplexer part for combining the first addresses and the second addresses and outputting data access addresses to the memory core area; and a path control part for controlling the address multiplexer part.

6 Claims, 2 Drawing Sheets

SEMICONDUCTOR MEMORY DEVICE WITH EFFICIENT MULTIPLEXING OF I/O PAD IN MULTI-CHIP PACKAGE

FIELD OF INVENTION

The present invention relates to a semiconductor memory device; and, more particularly, to a semiconductor memory device capable of multiplexing I/O pads in a multi-chip package.

DESCRIPTION OF PRIOR ART

In a semiconductor package, a wafer that is a raw material of a semiconductor is thinly processed and a variety of semiconductor circuits and bonding pads are formed on one side of the wafer. The wafer is sawed by a predetermined size to thereby produce dies. Then, the die is fixed within a plastic case having a lead frame.

The bonding pads and the lead frame are electrically connected to each other through a gold wire. Then, a molding is performed by filling the plastic case with an epoxy. In this manner, a semiconductor chip package is completely manufactured. Like this, it has been usual that one semiconductor device is provided within one package.

However, as the technology makes progress, more semiconductor integrated circuits need to be provided within one package. A multi-chip package (MCP) technology that packages a plurality of semiconductor dies stacked on a plane has been proposed.

In the case of the MCP semiconductor device, a plurality of semiconductor devices can be embedded within one package. Therefore, a size of the system can be greatly reduced.

FIG. 1 is a block diagram showing I/O pads of a conventional semiconductor device.

Referring to FIG. 1, a conventional semiconductor memory device includes: N address I/O pads A0 to An for receiving addresses; M data I/O pads D0 to Dm for inputting/outputting data; an address buffer part 10 for buffering the addresses inputted from the address I/O pads A0 to An; a data I/O buffer part 20 for buffering data inputted/outputted from/to the data I/O pads D0 to Dm; and a memory core area 30 having a plurality of unit cells. The memory core area 30 stores data transferred to/from the data I/O buffer part 20 or transfers the stored data to the data I/O buffer unit 20 according to the addresses A0 to An outputted from the address buffer part 10.

The memory device shown in FIG. 1 is a general memory device. The number of the input addresses is determined by the number of the unit cells provided in the memory core area 30 and the number of the data I/O pads is also determined. For example, the number of the unit cells is $2^N$, the number of the input addresses is N and thus N address input pads are provided.

Meanwhile, the number of the data I/O pads is determined by the number of the data inputted/outputted during one-time data access. For example, if the number of the data outputted during the data access by the input of the addresses is M, M data I/O pads are provided.

FIG. 2 is a sectional view of the MCP semiconductor device.

Referring to FIG. 2, the multi-chip package includes a first die 40 and a second die 60. The second die 60 is attached on the first die 14 by a spacer adhesive 50. Next, a bonding pad (not shown) of the first die 40 is electrically connected to a bonding wire 45, and a bonding pad (not shown) of the second die 60 is electrically connected to the bonding wire 65. Then, the multi-chip package is sealed with an epoxy 70. A reference numeral "80" represents a solder ball used as an external connecting terminal of the multi-chip package. A gold wire for connecting the lead frame and the bonding pad is not shown in FIG. 2.

As shown in FIG. 2, the multi-chip package can integrate the semiconductor devices having various functions in the same volume as that of the conventional single-chip package. In the case of the multi-chip package, the memory device and the system IC chip can be integrated within one package, thereby effectively implementing high performance systems.

However, if the semiconductor device shown in FIG. 2 is applied to the multi-chip package, the I/O pins must be designed to match with the multi-chip package. If the positions of the I/O pins are changed, arrangement of various circuits are changed. Thus, the semiconductor memory must be redesigned.

Accordingly, the memory device that can be applied to the single-chip package and the memory device that can be applied to the multi-chip package are separately developed.

SUMMARY OF INVENTION

It is, therefore, an object of the present invention to provide a semiconductor memory device that can be packaged in a single chip and in a multi chip due to the efficient multiplexing of address and data I/O pads.

In accordance with an aspect of the present invention, there is provided a semiconductor memory device including: a memory core area; a plurality of address input pads for transferring addresses; a first address buffer part for receiving the addresses from the plurality of address input pads and outputting first addresses; a plurality of multi I/O pads for inputting/outputting data or inputting/outputting addresses/data while multiplexing the addresses/data; a data I/O buffer part for receiving data from the plurality of multi I/O pads and transferring the data to the memory core area or receiving and outputting addresses; a second address buffer part for receiving the addresses from the data I/O buffer part and outputting second addresses; an address multiplexer part for combining the first addresses and the second addresses and outputting data access addresses to the memory core area 600; and a path control part for controlling the address multiplexer part to output the first addresses as the data access addresses or to output a combination of the first addresses and the second addresses as the data access addresses.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device having a column address path therein in accordance with the present invention will be described in detail referring to the accompanying drawings.

Figure 1:
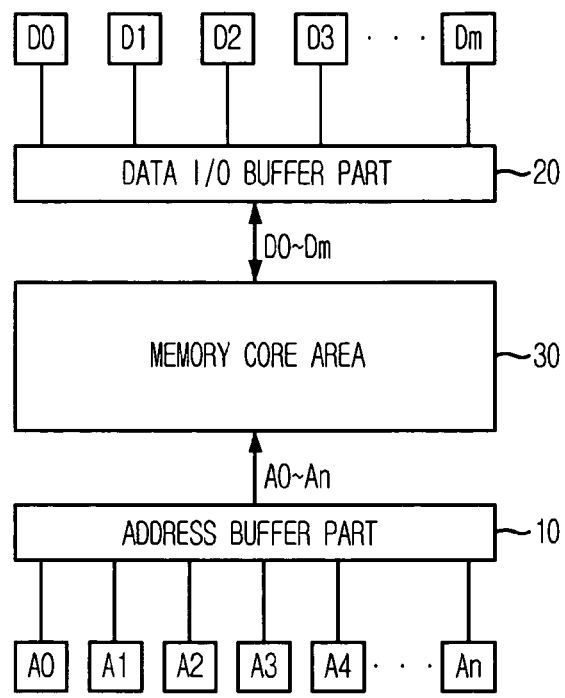
FIG. 1 is a block diagram showing I/O pads of a conventional semiconductor memory device.
Figure 2:
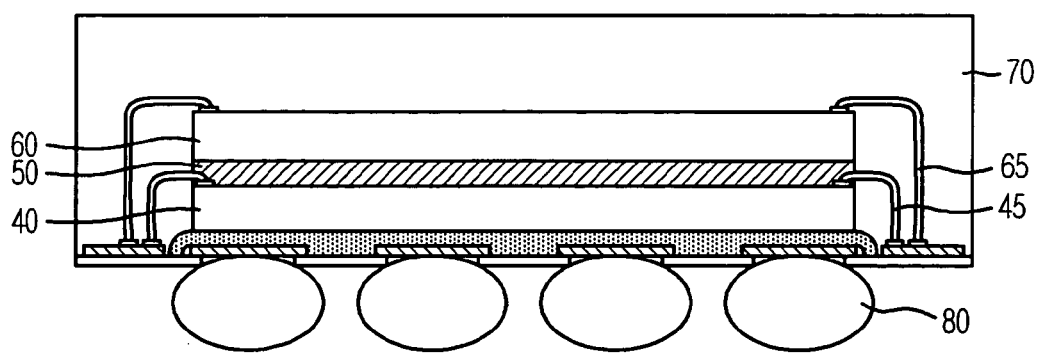
FIG. 2 is a sectional view of the semiconductor device shown in FIG. 1.
Figure 3:
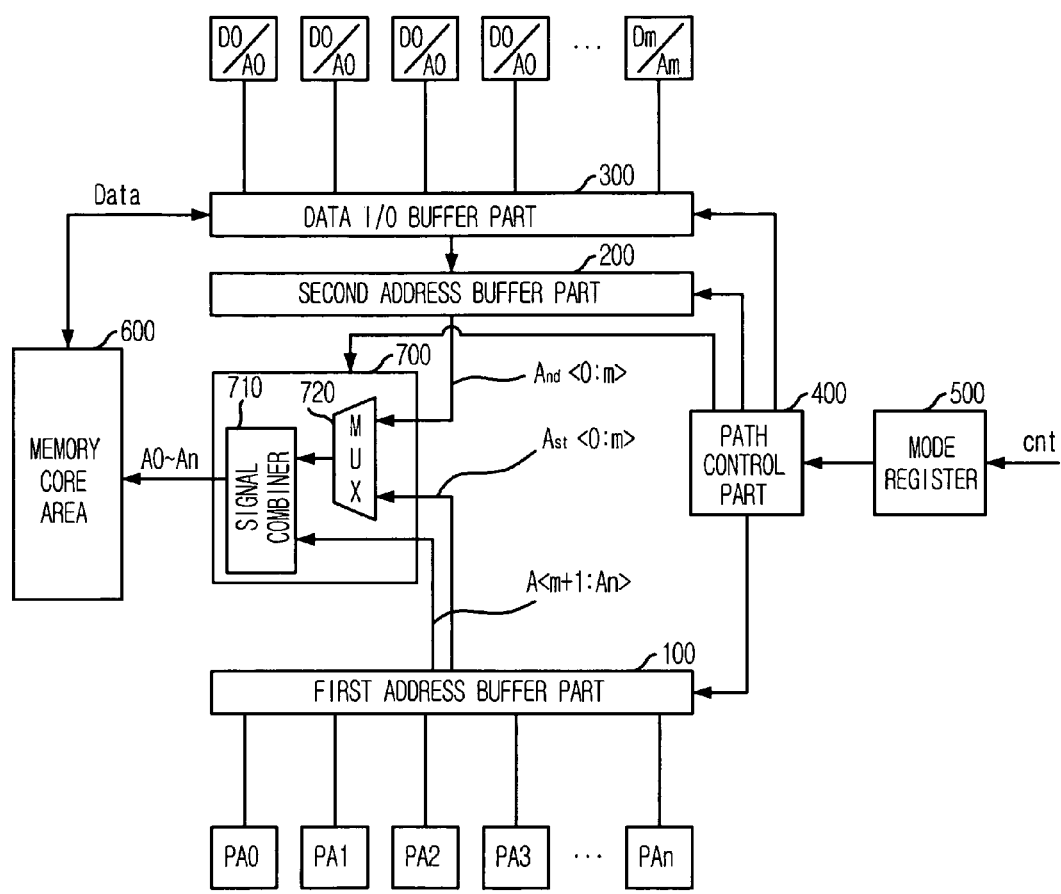
FIG. 3 is a block diagram of a semiconductor memory device in accordance with a preferred embodiment of the present invention.

FIG. 3 is a block diagram of a semiconductor memory device in accordance with a preferred embodiment of the present invention.

Referring to FIG. 3, a semiconductor memory device in accordance with an embodiment of the present invention includes a memory core area 600, a plurality of address input pads PA0 to PAn, a first address buffer part 100, a plurality of multi I/O pads D0/A0 to Dm/Am, a data I/O buffer part 300, a second address buffer part 200, an address multiplexer part 700, and a path control part 400.

The plurality of address input pads PA0 to PAn transfer addresses, and the first address buffer part 100 receives the addresses from the plurality of address input pads PA0 to Pan and outputs first addresses A<m+1:n> and Ast<0:m>. The plurality of multi I/O pads D0/A0 to Dm/Am input/output data or input/output data and addresses while multiplexing addresses/data. The data I/O buffer part 300 receives data from the plurality of multi I/O pads D0/A0 to Dm/Am and transfers the data to the memory core area 600 or receives and outputs addresses. The second address buffer part 200 receives the addresses from the data I/O buffer part 300 and outputs second addresses And<0:m>. The address multiplexer part 700 multiplexes and combines the first addresses A<m+1:n> and Ast<0:m> and the second addresses And<0:m> and outputs data access addresses A0 to An to the memory core area 600. The path control part 400 controls the address multiplexer part 700 to output the first addresses A<m+1:n> and Ast<0:m> as the data access addresses A0 to An, or to output a combination of the first addresses A<m+1:n> and Ast<0:m> and the second addresses And<0:m> as the data access addresses A0 to An.

The multiplexer part 700 includes a multiplexer 720 and a signal combiner 710. The multiplexer 720 selects some addresses Ast<0:m> among the first addresses A<m+1:n> and Ast<0:m> and one of the second addresses And<0:m>. The signal combiner 720 combines the selected signal from the multiplexer 720 and the remaining addresses A<m+1:n> among the first addresses A<m+1:n> and Ast<0:m>.

The path control part 400 controls the data I/O buffer part 300 to transfer the data inputted through the multi I/O pads D0/A0 to Dm/Am to the memory core area 600, and controls the second address buffer part 200 to output the addresses, which are inputted through the multi I/O pads D0/A0 to Dm/Am, as the second addresses And<0:m> of the address multiplexer part 700.

Also, the semiconductor memory device in accordance with an embodiment of the present invention further includes a mode register 500 for controlling the path control part 400. In detail, the mode register 500 controls the path control part 400 in response to an external control signal cnt so as to output the first addresses A<m+1:n> and Ast<0:m> as the data access addresses A0 to An or combine the first addresses A<m+1:n> and Ast<0:m> and the second addresses And<0:m> into the data access addresses A0 to An.

In accordance with the present invention, the second address buffer part 200 is disposed closest to the data I/O buffer part 300 to the maximum.

The path control part 400 controls the address multiplexer part 700 to operate corresponding to the timing difference when the second addresses And<0:m> and the first addresses A<m+1:n> and Ast<0:m> are inputted to the address multiplexer part 700.

Hereinafter, an operation of the semiconductor memory device in accordance with a preferred embodiment of the present invention will be described in detail with reference to FIG. 3.

First, the memory device includes the N address input pads PA0 to Pan for receiving and transferring only the addresses to the first address buffer part 100, and the multi I/O pads D0/A0 to Dm/Am for receiving and transferring the addresses or data.

If the multi I/O pads D0/A0 to Dm/Am are used for the data I/O, the multi I/O pads D0/A0 to Dm/Am transfers the external data to the memory core area 600 or outputs the data transferred from the memory core area 600 to the exterior.

If the multi I/O pads D0/A0 to Dm/Am are used for multiplexing, when the addresses are inputted from the exterior, the multi I/O pads D0/A0 to Dm/Am transfer the addresses to the second address buffer part 200 through the data I/O buffer part 300. When the data are transferred from the exterior, the multi I/O pads D0/A0 to Dm/Am transfer the data to the memory core area 600 through the data I/O buffer part 300.

If the semiconductor memory device in accordance with the present invention is packaged into the single chip, the addresses inputted through the N address input pads PA0 to Pan are transferred as the first addresses A<m+1:n> and Ast<0:n> to the multiplexer part 700 through the first address buffer part 100. The multiplexer part 700 outputs the first addresses A<m+1:n> and Ast<0:n> to the data access addresses A0 to An. The data corresponding to the data access addresses A0 to An are accessed in the memory core area 600.

At this time, the second address buffer part 200 is disabled, and the multi I/O pads D0/A0 to Dm/Am and the data I/O buffer part 300 are used only for the data input/output. It is controlled by the path control part 400. The corresponding address path is equal to the address path of the typical memory device, except that the addresses pass through the multiplexer part 700.

Meanwhile, if the semiconductor memory device in accordance with the present invention is packaged into the multi chip, the positions of the address I/O pins are changed, so that all addresses are not inputted through the address input pads PA0 to Pan.

For this, the semiconductor memory device in accordance with the present invention receives some addresses through the address input pads PA0 to Pan and the remaining addresses through the multi I/O pads D0/A0 to Dm/Am. In this case, the multi I/O pads D0/A0 to Dm/Am receive the addresses and the data by the multiplexing.

As shown in FIG. 3, M addresses among the N addresses are inputted through the multi I/O pads D0/A0 to Dm/Am and the remaining M+1 to N addresses are inputted through the address input pads PA0 to Pan.

Meanwhile, a location of the second address buffer part 200 is positioned closest to the data I/O buffer part 300 to the maximum in order to transfer the addresses to the data I/O buffer part 300 as fast as possible, that is, in order for the data I/O buffer part 300 to receive the addresses as fast as possible after it transfers the addresses.

Accordingly, there occurs a difference between a timing when the first addresses A<m+1:n> and Ast<0:n> are inputted to the address multiplexer part 700 and a timing when the second addresses And<0:m> are inputted thereto. In order to solve it, the path control part 400 controls the address multiplexer part 700 to perform the address multiplexing when both the first addresses A<m+1:n> and Ast<0:n> and the second addresses And<0:m> are inputted.

As described above, the present invention provides the semiconductor memory device that can be applied to both the single-chip package and the multi-chip package, while the conventional memory core area is still used, by additionally providing the second address buffer part 300 and the multiplexer part 700.

According to the present invention, one memory device can be applied to the single-chip package and the multi-chip package, that is, the semiconductor memory device can be manufactured with one-time design and manufacturing process regardless of the package types, thereby reducing the development period of the semiconductor memory device.

The present application contains subject matter related to Korean patent application No. 2003-98509, filed in the Korean Patent Office on Dec. 29, 2003, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
    a memory core area;
    a plurality of address input pads for transferring addresses;
    a first address buffer part for receiving the addresses from the plurality of address input pads and outputting first addresses;
    a plurality of multi I/O pads for inputting/outputting data or inputting/outputting addresses/data while multiplexing the addresses/data;
    a data I/O buffer part for receiving data from the plurality of multi I/O pads and transferring the data to the memory core area or receiving and outputting addresses;
    a second address buffer part for receiving the addresses from the data I/O buffer part and outputting second addresses;
    an address multiplexer part for combining the first addresses and the second addresses and outputting data access addresses to the memory core area; and
    a path control part for controlling the address multiplexer part to output the first addresses as the data access addresses or to output a combination of the first addresses and the second addresses as the data access addresses.

2. The semiconductor memory device as recited in claim 1, wherein the path control part controls the data I/O buffer part to transfer the data inputted through the multi I/O pads to the memory core area, and controls the second address buffer part to output the addresses, which are inputted through the multi I/O pads, as the second addresses of the address multiplexer part.

3. The semiconductor memory device as recited in claim 2, further comprising a mode register for controlling the path control part in response to an external control signal so as to output the first addresses as the data access addresses or combine the first addresses and the second addresses into the data access addresses.

4. The semiconductor memory device as recited in claim 1, wherein the second address buffer part is disposed closest to the data I/O buffer part to the maximum.

5. The semiconductor memory device as recited in claim 4, wherein the path control part controls the address multiplexer part to operate corresponding to a timing difference when the second addresses and the first addresses are inputted to the address multiplexer part.

6. The semiconductor memory device as recited in claim 1, wherein the multiplexer part includes:
    a multiplexer for selecting some addresses among the first addresses and one of the second addresses; and
    a signal combiner for combining the selected signals and the remaining addresses of the first addresses.

* * * * *